United States Patent
Palanisamy et al.

(10) Patent No.: US 7,248,022 B2
(45) Date of Patent: Jul. 24, 2007

(54) METHOD AND APPARATUS FOR DETERMINING THE AVAILABLE ENERGY OF A LITHIUM ION BATTERY

(75) Inventors: Thirumalai G. Palanisamy, Morristown, NJ (US); Harmohan N. Singh, Rockaway, NJ (US); Hector M. Atehortua, North Bergen, NJ (US); Steven Hoenig, Staten Island, NY (US)

(73) Assignee: Honeywell International, Inc., Morristown, NJ (US)

( * ) Notice: Subject to any disclaimer, the term of this patent is extended or adjusted under 35 U.S.C. 154(b) by 438 days.

(21) Appl. No.: 10/860,308

(22) Filed: Jun. 4, 2004

(65) Prior Publication Data
US 2005/0269993 A1    Dec. 8, 2005

(51) Int. Cl.
*H01M 10/44* (2006.01)
*H01M 10/46* (2006.01)

(52) U.S. Cl. .................................... 320/149

(58) Field of Classification Search ............... 320/132, 320/149, 162, 164
See application file for complete search history.

(56) References Cited

U.S. PATENT DOCUMENTS

| | | | |
|---|---|---|---|
| 4,433,294 A | 2/1984 | Windebank | |
| 5,708,347 A | 1/1998 | Palanisamy et al. | 320/132 |
| 5,736,835 A * | 4/1998 | Nakajo et al. | 320/112 |
| 6,127,806 A * | 10/2000 | Tanjo et al. | 320/132 |
| 6,215,312 B1 | 4/2001 | Hoenig | |
| 6,366,054 B1 | 4/2002 | Hoenig et al. | 320/132 |
| 6,411,911 B1 | 6/2002 | Hirsch et al. | 702/63 |
| 6,469,512 B2 | 10/2002 | Singh et al. | 324/426 |
| 6,586,130 B1 | 7/2003 | Guiheen et al. | 429/50 |
| 6,618,681 B2 | 9/2003 | Hoenig et al. | 702/63 |
| 2002/0193953 A1 | 12/2002 | Hoenig | |

* cited by examiner

*Primary Examiner*—Edward H. Tso
(74) *Attorney, Agent, or Firm*—Oral Caglar, Esq.

(57) ABSTRACT

In accordance with various embodiments, there is a method for determining the available energy of a battery. Various embodiments include the steps of applying an increasing current to the battery and measuring a response voltage of the battery when the increasing current is applied to the battery.

17 Claims, 3 Drawing Sheets

METHOD AND APPARATUS FOR DETERMINING THE AVAILABLE ENERGY OF A LITHIUM ION BATTERY

GOVERNMENT RIGHTS

This invention was made with government support under Government Contract F33651-98-C-2893 awarded by the United States Air Force. The government may have certain rights in the invention.

DESCRIPTION OF THE INVENTION

1. Field of the Invention

The invention relates to a method and an apparatus for determining the available energy of a battery.

2. Background of the Invention

It is often desirable to determine the amount of available energy, usually measured in amp hours (Ah), in a battery for reliable operation of devices. One method for predicting the amount of available energy in a battery, such as a lithium-ion battery, uses the open circuit voltage (OCV) as a state of charge (SOC) indicator. The OCV refers to the voltage measured across the battery terminals with no load on the battery. The SOC is expressed as a percentage of the total energy (Ah) storable in the battery when the battery is fully charged. For example, a battery capable of storing 100 Ah when it is fully charged will have 75 Ah remaining if the SOC is 75%.

Conventionally, the battery capacity is determined by charging the battery to the 100% SOC level and then measuring the time (t) expended, measured typically in hours, to discharge the battery to 0% SOC using a fixed discharge current (I), measured typically in Amperes. The product (I)×(t) represents the battery capacity in units of Ampere-hours (Ah). This approach to determining battery capacity, however, has several major drawbacks. One drawback is that these methods are time consuming and are thus not economically useful. Additionally, using these methods the battery cycle life and performance are degraded due to the required repetitive charge and discharge cycling.

Thus, there is a need to overcome these and other problems of the prior art and to provide better methodology and apparatus for determining the available energy of a battery quickly and without subjecting the battery to successive charge and discharge cycling.

SUMMARY OF THE INVENTION

In accordance with various embodiments, there is a method for determining the available energy of a battery. Various embodiments include measuring a response voltage of the battery as an increasing current, such as a linearly increasing current, is applied to the battery. When the response voltage reaches a predetermined voltage greater than the open circuit voltage of the battery before the current was applied, the corresponding input current is recorded. The available energy of the battery is proportional to the current when the voltage of the battery reaches the voltage that is greater than the open circuit voltage by a predetermined value.

In another embodiment, there is an apparatus that can be used to measure the available energy of a battery comprising a control module that comprises an electronics control system and a power supply. The power supply supplies a current ramp of a predetermined slope, such as a positive slope, to a battery until a voltage of the battery reaches a value greater than an open circuit voltage of the battery before the application of the current ramp by a predetermined amount. The apparatus also includes a current sensor disposed in series with, and between the power supply and the battery. The current sensor measures the current passing to and from the battery and a processor that determines the available energy of the battery based on the current when the voltage to the battery reaches a voltage greater than the open circuit voltage by a predetermined amount.

In another embodiment, there is a computer readable medium containing program code that configures a processor to perform a method for determining the available energy of a battery. The program code comprises program code for applying an increasing current to a battery and program code for measuring a response voltage of the battery when the increasing current is applied to the battery.

Additional embodiments will be set forth in part in the description which follows, and in part will be obvious from the description, or may be learned by practice of the invention. The advantages of the various embodiments will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in this specification and constitute a part of this specification, illustrate several embodiments and together with the description, serve to explain the principles of the invention.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Figure 1:
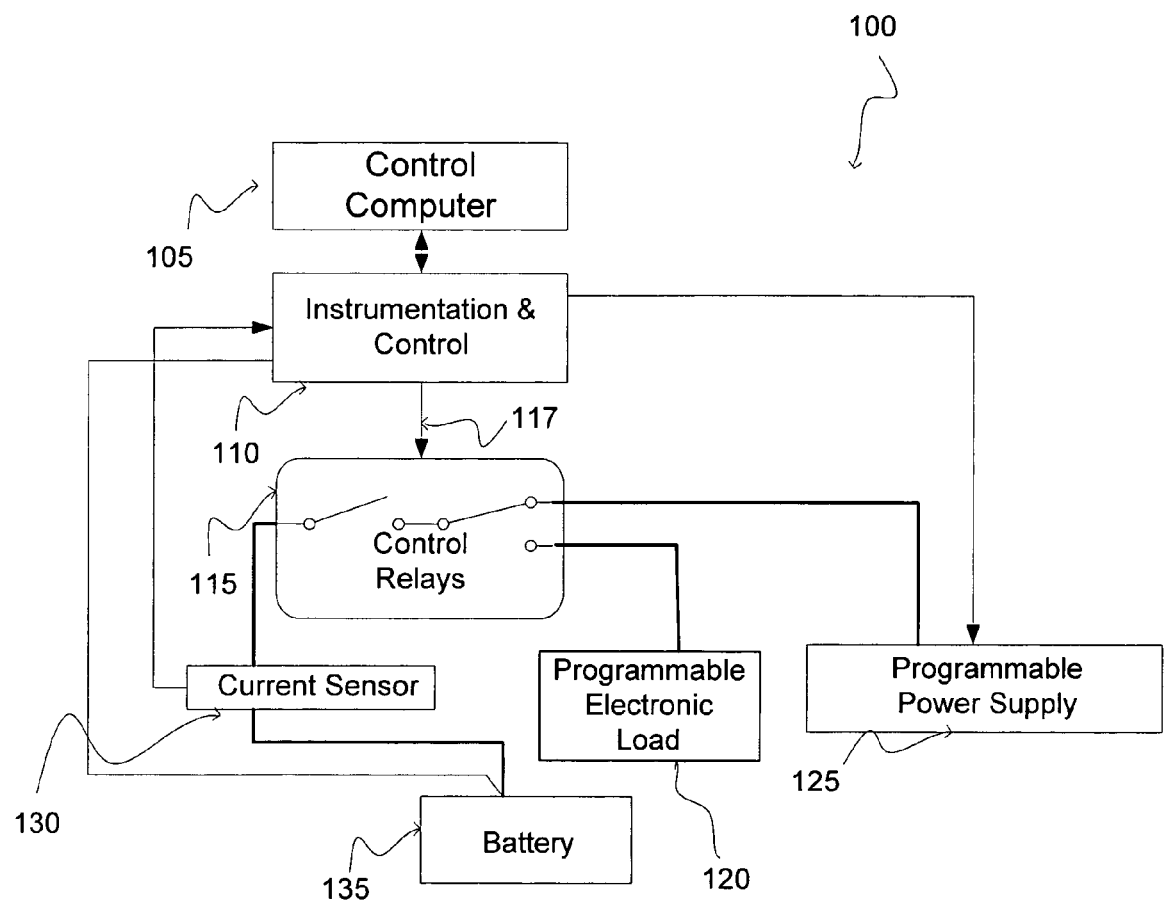
FIG. 1 depicts a block diagram of a system capable of determining the available energy of a battery in accordance with an exemplary embodiment.
Figure 2:
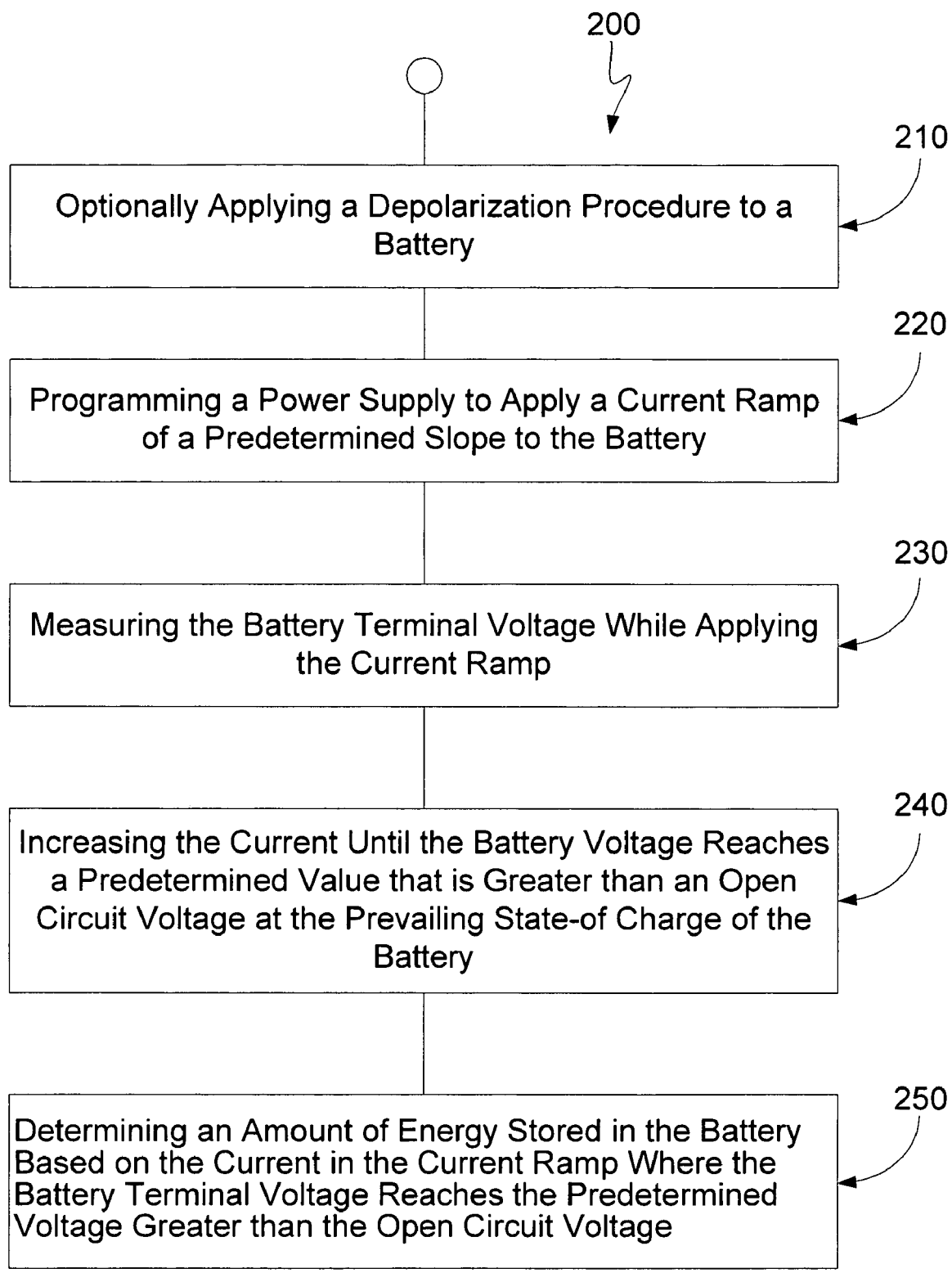
FIG. 2 depicts a flow chart of a method capable of determining the available energy of a battery in accordance with an exemplary embodiment.
Figure 3:
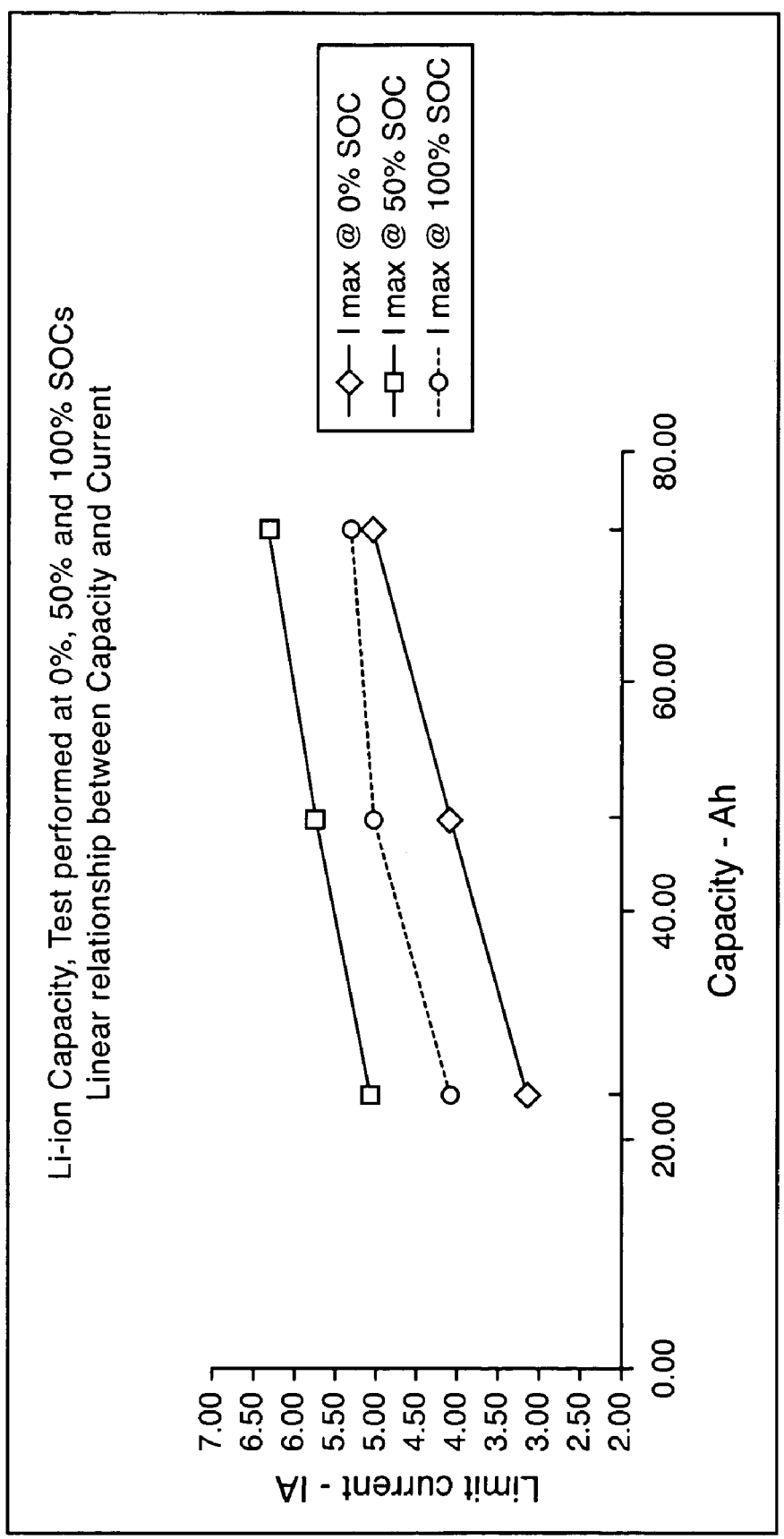
FIG. 3 depicts a graph that shows a linear relationship between the available energy of a battery and a limit current in accordance with an exemplary embodiment.

FIGS. 1-3 disclose, generally, apparatus and methods for determining the available energy of a battery.

FIG. 1 depicts an exemplary configuration of a system 100 that can determine the available energy of a battery. The exemplary system 100 can include various modules, such as a control computer 105, an instrumentation and control module 110, a control relay 115, an electronic load 120, a power supply 125, and a current sensor 130. Also shown in FIG. 1 is a battery 135, such as a lithium ion battery.

In various embodiments, control computer 105 can include a set of capacity measurements algorithms. Control computer 105 can also include any software drivers that can be used to control other modules of the exemplary system.

Control computer 105 is connected to instrumentation and control module 110. Control computer 105 can be any suitable computer such as, for example, a Gateway Pentium computer with a National Instruments data acquisition module installed therein. In various embodiments, instrumentation and control module 110 can include an analog-to-digital converter (ADC), a digital-to-analog converter (DAC), and an electronic control signal generator (ECSG). Instrumentation and control module 110 can be, for example, a National Instruments signal conditioning system. The ADC and DAC process information input into the instrumentation and control module 110 and coordinate with the ECSG to operate the other modules in system 100. For example, the ADC, the DAC, and the ECSG can control relay 115, electronic load 120, and/or power supply 125. Power supply 125 and electronic load 120 can both be programmable. Power supply 125 can be, for example, a Hewlett-Packard model 6032 power supply. Power supply 125, in conjunction with instrumentation and control module 110, can apply a current ramp such as an increasing or decreasing current ramp of predetermined slopes, to battery 135. In various arrangements, power supply 125 and/or instrumentation and control module 110 can include the computer software that controls the slope of the current ramp.

In various embodiments, control relay 115 is used to connect battery 135, whose available energy is to be determined, to electronic load 120 and/or power supply 125. For example, instrumentation and control module 110 can control relay 115 by applying a contact closure control signal over a line 117 to switch battery 135 in and out of the circuit. When relay 115 is open, battery 135 is taken out of the circuit and no current is applied. When relay 115 is closed, battery 135 is in the circuit and a current can be applied. Current sensor 130, such as a current shunt, can be placed in a series with battery 135. An exemplary current sensor 130 can include, for example, a 50-amp/50-millivolt shunt connected to a channel of the ADC. The 50-amp/50-millivolt shunt selection is exemplary of batteries where currents up to 50-amps may be encountered. The shunt selection can be performed to result in measurement sensitivity suitable for the battery being tested. Other suitable techniques can also be used to measure current, such as a Hall effect device. The sensed voltage, an analog quantity, can be converted to digital form by ADC in instrumentation and control module 110. The digital data of these parameters can be supplied to control computer 105. In this manner, current sensor 130 can be used to measure the amount of current going to, or coming from, battery 135. This can be performed by measuring the voltage drop across the current shunt and dividing the voltage drop by the shunt resistance. While electronic load 120 is disclosed as being connected to battery 135, various embodiments of system 100 do not require the use of electronic load 120. In some embodiments, the electronic load 120 can be used to check the battery capacities via conventional discharge methods.

In various embodiments, system 100 can be used to determine the available energy of a lithium ion battery. FIG. 2 shows an exemplary flow chart 200, where at 210, power supply 125 can be programmed to apply a current ramp of a predetermined slope, such as a positive slope to battery 135. The slope of the current ramp can be dependent upon the Ah rating range of the battery group of which the available energy is to be determined. At 230, a battery current can be determined by measuring the voltage across current sensor 130 in real time as the increasing current is applied to battery 135. Also in real time, the battery terminal voltage can be measured by the ADC in the instrumentation and control module 110. The voltage and the current information thus measured are monitored by control computer 105. As shown at 240 the current supplied to battery 135 can increase until the battery terminal voltage, measured using the ADC and the computer, exceeds the starting OCV (OCV before the current is applied) of the battery by a predetermined safe value. In some embodiments for example, the terminal voltage can increase to 50 mV above the starting OCV or 50 mV multiplied by the number of cells within the battery.

In various embodiments, the current ramp can be applied to battery 135 until the battery terminal voltage reaches above the OCV by, for example, 50 mV per cell connected in series within the battery. While 50 mV has been used as an exemplary voltage, other voltages are acceptable and contemplated. In various embodiments where the battery has more than one cell, the predetermined voltage of, for example, 50 mV can be applied to each cell. For example, in a battery having five cells in series, the voltage can be five times 50 mV, i.e., 250 mV above the battery OCV corresponding to the prevailing SOC of battery 135. The current corresponding to the point where the battery terminal voltage reaches the predetermined value above the OCV can be referred to as the limit current.

FIG. 3 is an exemplary graph of the relationship between the limit current and the available energy (measured in Ah) of the battery according to various embodiments. FIG. 3 shows three exemplary single cell lithium ion batteries, (a), (b), and (c). Battery (a) has a rated capacity of 25 Ah, battery (b) has a rated capacity of 50 Ah, and battery (c) has a rated capacity of 75 Ah. The batteries (a)-(c) were measured at 0%, 50%, and 100% SOC. It can be seen from FIG. 3 that the limit current is directly proportional to the available energy for a battery of a given rated capacity and a prevailing SOC. The measured limit current can be used to compute the actual available energy (Ah) present in the battery.

In various embodiments, the limit current can have a direct relationship with the stored energy of the battery. For example, the battery capacity and the limit current can be related by an equation generally of the form shown in equation (1):

$$y = mx + c \qquad (1)$$

where x is the limit current, y is the battery capacity, and m and c are constant. The form of equation (1) can be determined by testing batteries of varying capacities at various SOCs. The limit current and corresponding capacities, which can be determined using conventional capacity determination approaches, can be plotted in the form of an x-y graph. Line shape approximations of data points for various SOCs, e.g., 0%, 50%, etc. can then be expressed in the equation. In an embodiment, the constants can vary with the target battery set capacity range. Generally, a set of constants can cover a wide range of battery types.

In various embodiments, the available energy of a battery having an unknown energy content can be determined by subjecting the battery to a current ramp test, measuring the limit current, and comparing the measured value to the graph or inputting the measured values into the mathematical equation.

Referring back to FIG. 2, after increasing the current until the battery reaches the limit current, the amount of energy stored in the battery can be determined (see step 250) based on a generated relationship. When the battery terminal voltage reaches the predetermined voltage above the OCV, the current ramp can be reversed. In an embodiment, the current is decreased linearly to zero. However, the current can be brought to zero via other routes. Current measurements can be terminated when the current reaches zero in the down ramp.

If battery 135 is polarized, i.e., the battery terminal voltage is not stable, then, in various embodiments, a depolarization procedure can be performed prior to the current supplied to battery 135 reaching the limit current. An exemplary depolarization procedure can be found in U.S. Pat. No. 5,708,347, which is incorporated herein in its entirety. In an exemplary embodiment, battery 135 can be first discharged at a current load of between about 0.5 to about 1.0 percent of the current capacity of battery 135 for a period of time sufficient to discharge the voltage resulting from the polarization or surface charge of battery 135. Such a discharge time can be, for example, at a minimum, about 30 seconds. For example, the current discharge of a 100 Ampere-hour rated battery would be between 0.5 to 1.0 amps for a minimum of 30 seconds. The discharge time, however, should not exceed the time it takes to discharge the useful energy stored in the battery plates. Alternatively, the discharge of the battery can continue until the battery terminal voltage decreases by about 0.1 volts.

At the end of the discharge period, the battery is placed in the open circuit state and the voltage is continuously monitored. If the battery is still polarized, the terminal voltage will immediately increase, go through a maximum, and fall rapidly. The rate of the voltage increase indicates the severity of the battery polarization. If voltage change is greater than a predetermined value, then a second discharge may be immediately applied to the battery. Alternatively, if the battery is not severely polarized, the battery may be placed in a relaxed state for a period of about five minutes before subjecting the battery to another discharge. The process of discharging the battery and optionally relaxing the battery in open circuit continues until the rate of change of the battery open circuit voltage is less than 10 mV/30 seconds. At this point the battery is depolarized.

Various embodiments include a computer controllable medium. For example, embodiments can include a power supply control program that can control the amount of current supplied to the battery. The power supply control program can be stored in at least one of control computer 105, instrumentation and control module 110, electronic load 120, and power supply 125. The power supply control program can include subroutines that direct power supply 125 to apply an increasing current ramp to battery 135.

Various embodiments can include a current sensor program code that can control current sensor 130. The current sensor program code can be stored in at least one of control computer 105, instrumentation and control module 110, and current sensor 130. The current sensor program can direct current sensor 130 to measure the battery current. For example, when the power source program code directs power source 105 to apply a current ramp, such as an increasing or decreasing current ramp, to battery 135, the current sensor program can direct current sensor 130 to measure the voltage drop across the current sensor 130. Information about the measured voltage drop can be analyzed by instrumentation and control module 110 to yield the battery current. Instrumentation and control module 110 can also determine the battery voltage directly by measuring the voltage across the positive and negative battery terminals.

Various embodiments include a processor control program that can determine an available amount of energy in battery 135. The processor control program can be stored in at least one of control computer 105 and instrumentation and control module 110. The processor control program can receive information from electronic load 120, power supply 125, current sensor 130, and the battery 135. The received information can be processed and compared to the generated graph or used in the mathematical algorithm to determine the available amount of energy in battery 135.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for determining an available energy of a battery comprising:
    applying an increasing current ramp to a battery;
    measuring a battery terminal voltage of the battery when the increasing current ramp is applied to the battery until the battery terminal voltage reaches a predetermined battery terminal voltage greater than an open circuit voltage; and
    determining the available amount of energy in the battery based on a limit current measured when the battery terminal voltage reaches the predetermined battery terminal voltage, wherein the available energy of the battery is proportional to the limit current.

2. A method for determining the available energy of a battery according to claim 1, wherein the increasing current ramp is applied linearly.

3. A method for determining the available energy of a battery according to claim 1, wherein the battery is a lithium ion battery.

4. A method for determining the available energy of a battery according to claim 1 further comprising:
    maintaining a constant voltage difference between a limit voltage and the open circuit voltage.

5. A method for determining the available energy of a battery according to claim 1 further comprising:
    depolarizing the battery prior to applying the increasing current ramp.

6. A method for determining the available energy of a battery according to claim 1, wherein the current is increased until the battery terminal voltage reaches 50 mV above the open circuit voltage.

7. A method for determining the available energy of a battery according to claim 1, wherein the battery has at least one cell and wherein the current is increased until the battery terminal voltage reaches 50 mV times the number of cells in the battery above the open circuit voltage.

8. A method for determining an available energy of a battery comprising:
    applying a current ramp of a predetermined slope to a battery;
    measuring a battery terminal voltage while applying the current ramp;
    increasing the current ramp until the battery terminal voltage reaches a predetermined value greater than an open circuit voltage of the battery at a prevailing state-of-charge of the battery; and p1 determining the amount of energy stored in the battery based on a limit current measured at the point where the battery terminal voltage reaches the predetermined value greater than the open circuit voltage, wherein a relationship of limit current with the stored energy of the battery is determined by measuring the limit current of multiple batteries of varying capacities at various stacies-of-charge.

9. A method for determining the available energy of a battery according to claim 8 further comprising:

depolarizing the battery prior to a step of measuring the battery terminal voltage while applying the current ramp.

10. A method for determining the available energy of a battery according to claim 8, wherein the current is increased until the battery terminal voltage is greater than the open circuit voltage by 50 mV above the open circuit voltage.

11. A method for determining the available energy of a battery according to claim 8, wherein the battery has at least two cells and wherein the current is increased until the battery terminal voltage is greater than the open circuit voltage by 50 mV times the number of cells above the open circuit voltage.

12. A method for determining the available energy of a battery according to claim 8, wherein the available energy of the battery is linearly proportional to the limit current.

13. An available energy of a battery measuring apparatus comprising:
   a control module comprising an analog-to-digital converter, a digital-to-analog converter, and an electronics control system;
   a power supply that supplies an increasing current ramp of a predetermined slope to a battery until a voltage of the battery reaches a predetermined value greater than an open circuit voltage of the battery at a prevailing state-of-charge of the battery;
   a current sensor disposed in series between the power supply and the battery to measure a current passing from the battery;
   a sensor electrically connected to the battery to measure the battery terminal voltage; and
   a processor that determines the available energy of the battery based on the limit current that is measured when the voltage to the battery reaches the predetermined voltage greater than the open circuit voltage and based on a predetermined relationship between the limit current and the stored energy of the battery.

14. An available energy of a battery measuring apparatus according to claim 13, wherein the predetermined value is 50 mV greater than the open circuit voltage of the battery at the prevailing state of charge of the battery.

15. An available energy of a battery measuring apparatus according to claim 13, wherein the battery has at least one cell and wherein the current is increased until the battery terminal voltage is greater than the open circuit voltage by 50 mV times the number of cells at the prevailing state of charge of the battery.

16. An available energy of a battery measuring apparatus according to claim 13 further comprising:
   a battery terminal voltage sensor in series between the power supply and the battery to measure the battery terminal voltage.

17. A method for determining the available energy of a battery, comprising:
   controlling the amount of current supplied to a battery by using a power supply control program;
   controlling a current sensor to measure a response voltage of the battery when the power supply control program directs a power source to apply an increasing current ramp to the battery by using a current sensor program; and
   determining an available amount of energy in the battery once the power supply control program directs a power source to apply the increasing current ramp and the current sensor measures the response voltage, wherein the available amount of energy in the battery is directly proportional to a limit current determined at the point when the voltage of the battery reaches a predetermined voltage greater than an open circuit voltage of the battery.

* * * * *